March 15, 1955 A. D. LA RUE 2,704,337

MAGNETRON TUNERS

Filed March 18, 1952 3 Sheets-Sheet 1

INVENTOR
ALBERT D. LARUE
BY Elmer J. Gorn
ATTORNEY

INVENTOR
ALBERT D. LARUE
BY Elmer J. Gorn
ATTORNEY

March 15, 1955 A. D. LA RUE 2,704,337

MAGNETRON TUNERS

Filed March 18, 1952 3 Sheets-Sheet 3

INVENTOR
ALBERT D. LARUE
BY Elmer J. Gorn
ATTORNEY

United States Patent Office 2,704,337
Patented Mar. 15, 1955

2,704,337

MAGNETRON TUNERS

Albert D. La Rue, Lexington, Mass., assignor to Raytheon Manufacturing Company, Newton, Mass., a corporation of Delaware Application March 18, 1952, Serial No. 277,158

14 Claims. (Cl. 315—39.61)

This invention relates to electron discharge devices of the magnetron type, and more particularly to tuning structures for varying the operating frequency of magnetron oscillators.

It is well known that the frequency of a cavity magnetron oscillator may be varied by the insertion of tuning elements into the cavities of the magnetron. It has been found, however, that, when the tuning elements are metallic and are attached to a metallic support, the tuning elements, themselves, will resonate at various unwanted frequencies. If any of these frequencies move sufficiently close to the operating frequency of the magnetron as said operating frequency is varied over its range by moving the tuning structure, they will sap energy from the magnetron thereby decreasing the efficiency of operation of the magnetron, if indeed operation is at all possible.

These tuner resonances occur in families similar to the modes in the magnetron anode structure. The basic resonance of each family occurs when a pair of the adjacent tuner elements resonates. This, in turn, occurs when the electrical length of the tuning fingers as modified by the various reactive load coupled thereto is an odd number of quarter-wave lengths long. Thus, for example, when the electrical wave length of the tuner fingers is a quarter-wave length long, a tuner resonance occurs, and, similarly, when the electrical length of the tuner fingers is three-quarters of a wave length long, a tuner resonance occurs.

This invention discloses a structure whereby the frequency of the various resonances may be adjusted, and indeed adjacent families of resonances may be separated further in frequency to allow the undisturbed operation of the magnetron over a range of frequencies intermediate the families of tuner resonances. Specifically, a reactive load may be positioned between the fingers at a point between the ends of the fingers along the length of the line made up by the fingers, and said load may be adjusted to behave as an inductive load which decreases the line inductance for one family of tuner resonances and as a capacitive load which increases the line capacitance for another family of tuner resonances, thereby increasing the frequency of one set of tuner resonances while decreasing the frequency of a lower adjacent family of tuner resonances.

Other and further objects and advantages of this invention will be apparent as the description thereof progresses, reference being had to the accompanying drawings, wherein.

Figure 1:
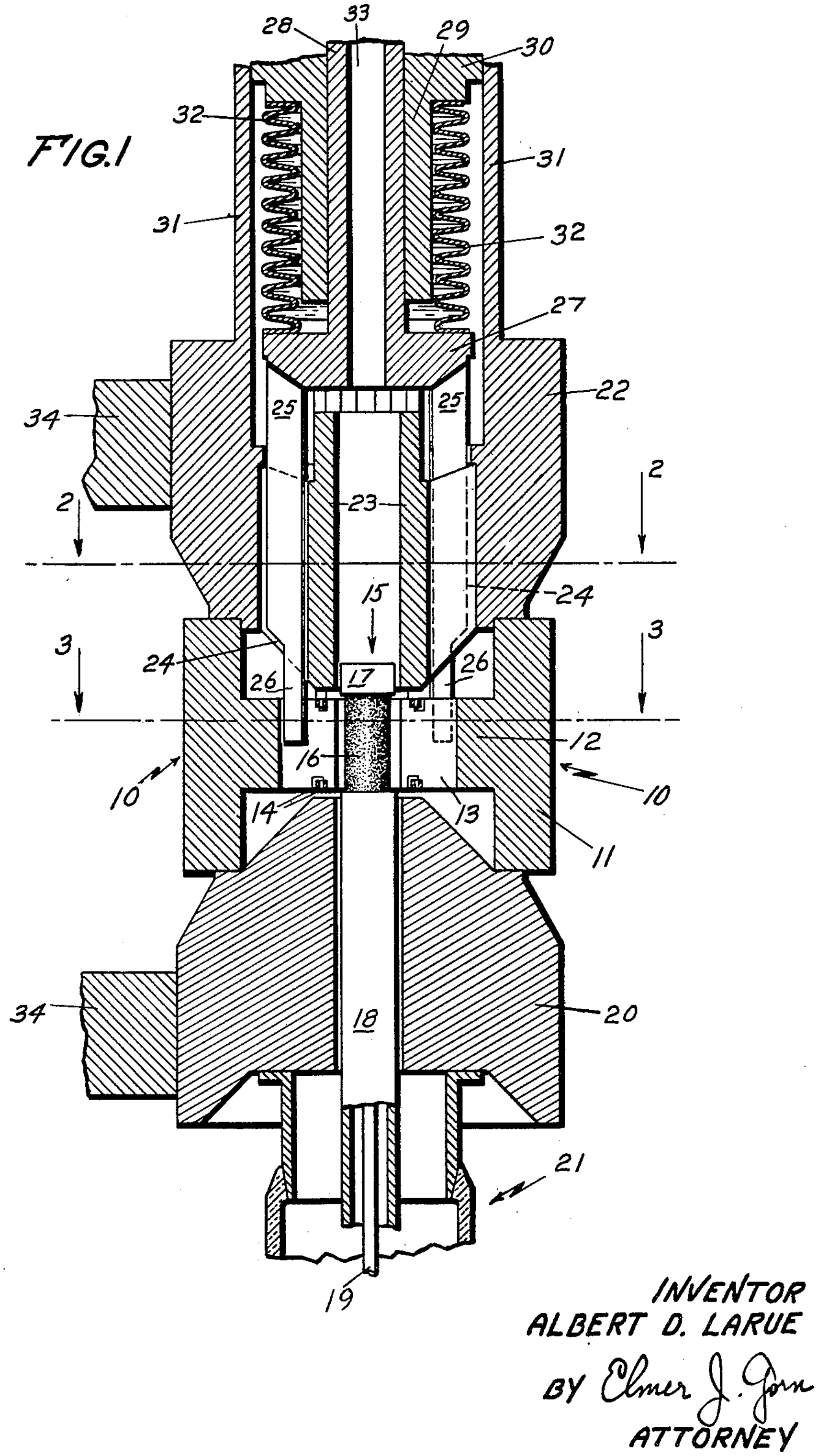
Fig. 1 illustrates a longitudinal cross-sectional view of a magnetron oscillator embodying this invention.
Figure 4:
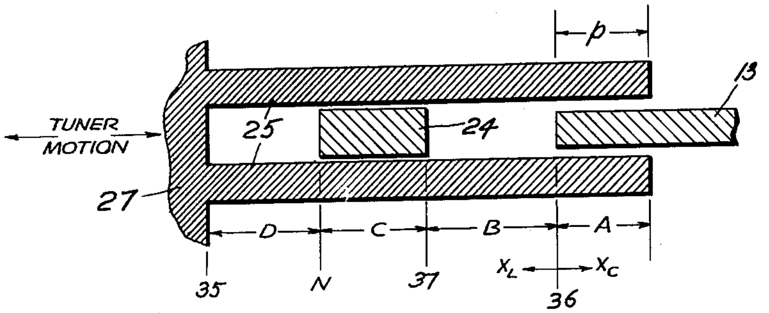
Figure 5:
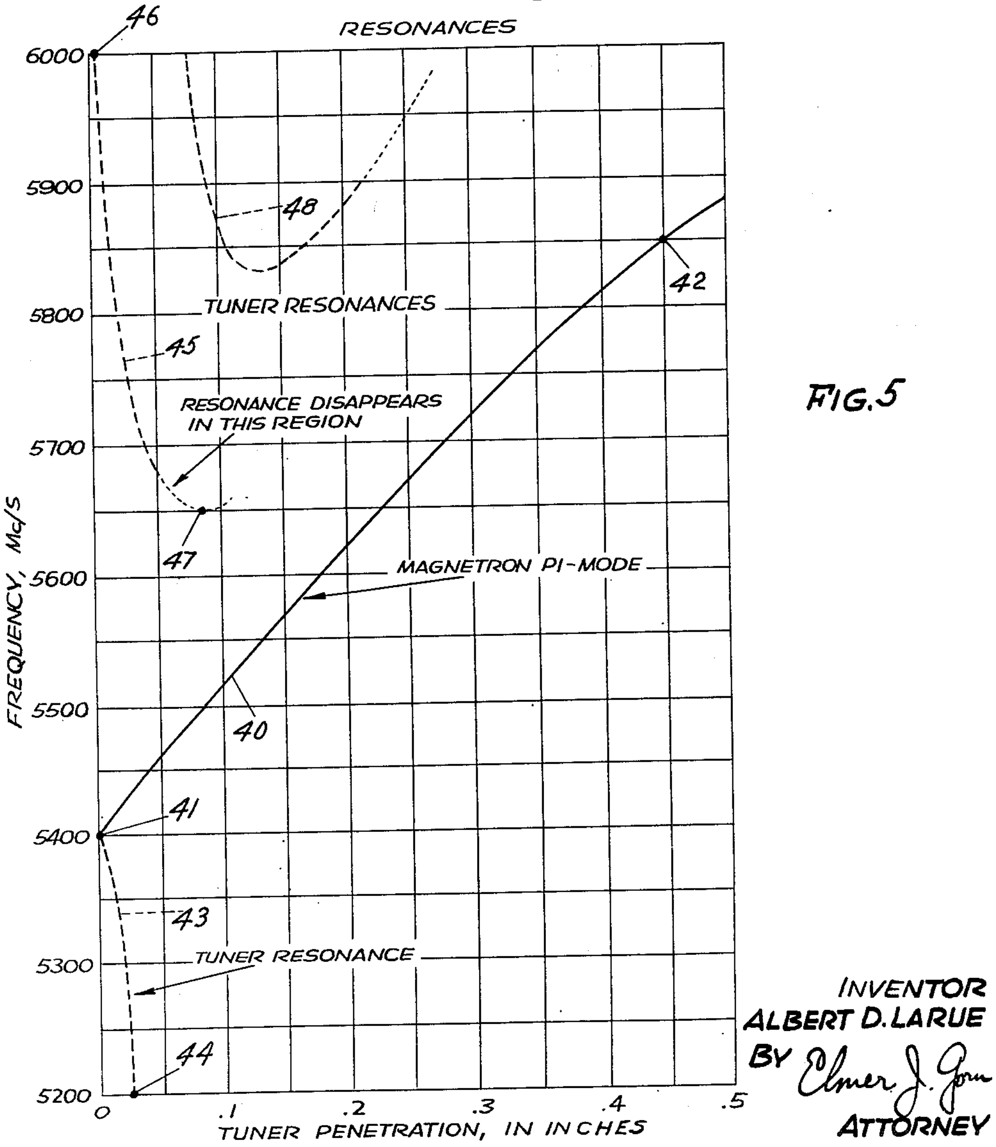

Fig. 4 illustrates a view of a pair of tuner fingers, together with the reactive loads coupled thereto, said tuner fingers being, for example, substantially equivalent to those used in the device illustrated in Fig. 1; and Fig. 5 illustrates a graph indicating the physical position of the tuner structure as a function of the magnetron operating frequency and as a function of the tuner resonances encountered.

Figure 2:
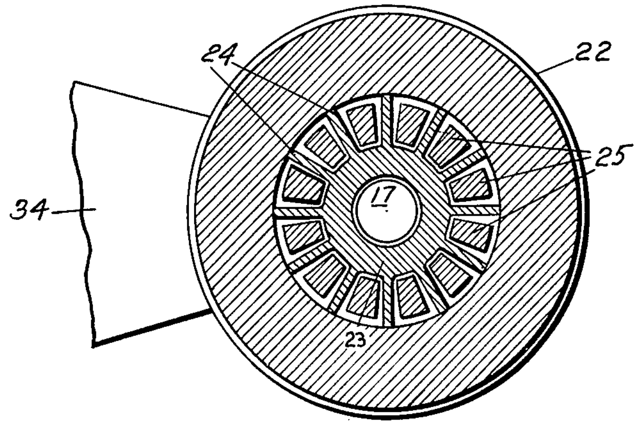
Fig. 2 illustrates a transverse cross-sectional view of the device shown in Fig. 1 taken along line 2—2 of Fig. 1.
Figure 3:
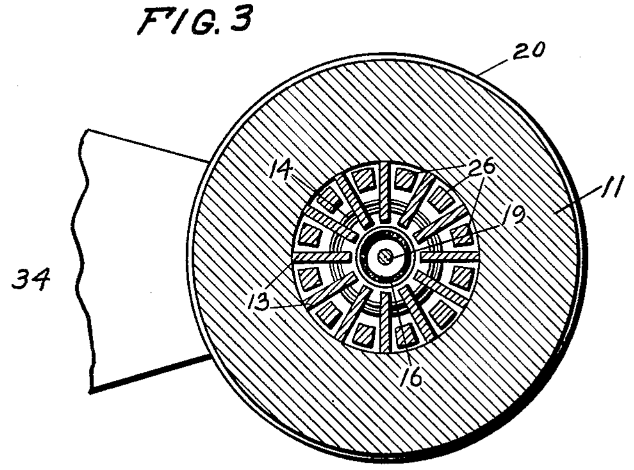
Fig. 3 illustrates another transverse cross-sectional view of the device shown in Fig. 1 taken along line 3—3 of Fig. 1.

Referring now to Figs. 1, 2 and 3, there is shown a magnetron anode structure 10 comprising an anode block 11 of conductive material, such as copper. Anode block 11 is made of a hollow cylindrical member having an annular abutment 12 extending radially inwardly from the inner surface of the cylindrical member 11. Extending radially inwardly from the abutment 12 is a plurality of anode members 13 which are substantially planar and rectangular in shape, and which lie parallel to the axis of cylindrical member 11. Anode members 13 are alternately connected on their upper and lower edges adjacent their inner ends by pairs of conductive straps 14 which prevent the operation of the magnetron at spurious anode resonance frequencies according to well-known practice.

Positioned inside the space defined by the inner ends of anode members 13 is a cathode structure 15 which may be of any desired well-known type. As shown here, the cathode is of the directly-heated type wherein a cylinder 16 of compressed electron emissive material and refractory metal is positioned axially of the anode cylinder 11 and is held at its upper end by a metal cap 17, and its lower end by a metal sleeve 18 through which extends a rod 19 which is securely fastened to cap 17. By suitable application of a potential between the rod 19 and the cylinder 18, current may be caused to flow through the cylinder 16, thereby heating it to electron emitting temperature.

The sleeve 18 extends downwardly beyond the end of the anode block 10 and through a lower magnetic pole piece 20, which is hermetically sealed to anode block 10. The cylinder 18 is spaced from the lower magnetic pole piece 20 as it passes therethrough, and is insulatingly supported with respect thereto by an insulating seal partially shown at 21. The insulating seal 21 may be of any desired type well known to persons skilled in the art. Rod 19 extends downwardly beyond the end of cylinder 18 and is insulatingly sealed with respect thereto by means of an insulating seal, not shown.

Hermetically sealed to the upper end of anode block 10 is an upper magnetic pole piece 22. Upper magnetic pole piece 22 has an inner cylinder core member 23 positioned concentric with the cathode structure 15 and somewhat greater in diameter than the cathode structure. Extending outwardly from the core member 23 to the main pole piece 22 is a plurality of splines 24 which have thickness on the same order as the thickness of the anode members 13, and are positioned, respectively, above the anode members 13. The splines 24 are rigidly attached to the inner core member 23 and the main pole piece 22, thereby rigidly supporting the magnetic structure comprising members 22, 23 and 24 with respect to the anode structure 10.

Extending downwardly through the space between each pair of adjacent magnetic splines 24 are tuning elements 25. Tuning elements 25 have cross sections of the same general shape as the cross sections of the spaces through which they pass. However, their cross sections are somewhat smaller than cross sections of the spaces between the splines 24, and, therefore, they are substantially spaced on all edges from the magnetic pole piece structure through which they pass. The members 25, after passing through the magnetic pole structure, enter the cavities formed by each pair of adjacent anode members 13.

The portions of the tuning elements 25 which enter the tuning cavities are cut away at the backs thereof such that they are somewhat smaller in cross-sectional area at this point. The portions 26 of the tuning elements 25 which enter the cavities are so positioned that they enter the cavities in the areas adjacent the outer or back portions of the cavities. Since the tuning elements 25 are metal, they act as inductive or eddy current tuners and upon being inserted in the back portions of the anode cavities, which contain the high current regions of the cavities, decrease the inductance of the cavities by eddy current tuning, thereby increasing the operating frequency of the magnetron.

The elements 25 are rigidly attached at their upper end to a metal flange 27, which is made integral with a cylindrical member 28. Member 28 extends up through a cylindrical support member 29 in slidable contact therewith. A flange 30 on the upper end of cylindrical member 29 is hermetically sealed to a cylindrical extension 31 of upper magnetic pole piece 22. A flexible bellows 32 is provided, one end of which is attached to flange 30 and the other end of which is attached to the movable support flange 27, such that the tuning elements 25 and the support flange and cylindrical members 27 and 28 may slidably move in the support cylinder 29 while being hermetically sealed to the remainder of the magnetron. A hole 33 extending down through cylinder 28 into the interior of the magnetron is used for exhaust purposes during the manufacture of the device, and is sealed at its upper end by a glass seal, not shown. With the application of a suitable heater potential to the cathode structure, a suitable anode potential between the cathode structure and the anode, and a suitable magnetic field between the pole pieces 20 and 22, said magnetic field being produced, for example, by a permanent magnet partially shown at 34, the magnetron may be made to produce oscillations whose frequency is substantially the resonant frequency of the cavities formed by the anode members 13 and the spaces defined therebetween.

Referring now to Fig. 4, a simplified treatment will be undertaken of the conditions existing within a tuner slot for a tuner penetration of a distance $p$ into the anode members. A single anode member 13 is shown with two tuner elements 25 having their lower ends spaced one on either side thereof, the upper ends of the fingers being attached to the support flange 27 and a portion of one of the magnetic splines 24 being positioned intermediate the ends of the transmission line formed by the tuners fingers 24. The distance $p$ is the distance that the tuner fingers have been inserted into the anode cavities, and will be known as the penetration. There is shown a section labeled A which is that section of the transmission line which includes the portions of the fingers inserted into the anode cavities and the portion of the anode member 13 enclosed therebetween. Section A may be thought of as a capacitance made up of two condensers in series, the condenser plates being provided by the two tuner fingers and the magnetron anode member therebetween. Section B is the section of the transmission line made up by the section of the tuner elements between the magnetron anode members and the lower end of the magnetic splines 24, and may be considered as a simple parallel plate transmission line. Section C is the portion of the transmission line made up of the portions of fingers 25 between which the magnetic spline 24 is positioned. Section D is the portion of the tuner slot forming a shorted section of parallel plate transmission line with the shorting member being the support flange 27.

Resonance in this simplified system will occur at the frequency where the transmission line transforms the short circuit occurring at point 35, the junction of the tuner elements 25 with the shorting support flange 27, to an inductive reactance $X_L$ at point 36, the upper edge of the anode member 13 which is equal to the capacitance reactance $X_c$ provided by the tuner to magnetron anode member capacitance. A change in any of the dimensions in the system will affect the resonant frequency. However, as a practical matter, many of the geometrical features are substantially dictated by design considerations. The geometry of the magnetron from the anode members 13 to the lower edge of the spline 24 indicated as point 37 is usually fixed by the tuning requirements for the magnetron $\pi$ mode, the magnetic field shape required, the mechanical clearances, and possibly the thermal considerations. In addition, a minimum length C for the magnetic pole spline 24 is required in order that suitable magnetic paths be provided from the outer to the inner portions of the magnetic pole. The length of the section D, in addition, must be at least long enough to allow sufficient tuner movement from the completely extracted to the completely inserted tuner positions to provide the required tuning.

The clearance between the magnetic spline 24 and the tuning elements and between the anode member 13 and the tuning elements usually has a minimum figure governed by mechanical tolerances. This leaves two parameters which may be adjusted for the elimination of tuner resonance interference over the range of frequencies needed for the magnetron $\pi$ mode. First, the length of the section D may be adjusted beyond the minimum length required for the movement of the tuner and, second, the length of the section C may be adjusted above the minimum length required for the magnetic field path.

Referring now to Fig. 5, there is shown a graph illustrating operating conditions which may be produced in a structure of the type illustrated in Figs. 1 through 4. Along the axis of abscissae there is plotted tuner penetration in inches where the tuner penetration is the distance $p$, in Fig. 4, which the tuner fingers are inserted into the cavities of the anode structure. Along the axis of ordinates there is plotted frequency in megacycles.

There is shown on the graph a curve 40 illustrating the relationship between the $\pi$ mode operating frequency of the magnetron and the tuner penetration. When the tuner penetration is zero, the $\pi$ mode operating frequency of the magnetron is approximately 5400 megacycles as is shown by point 41 on the curve. As the tuner is inserted into the cavities the $\pi$ mode frequency of the magnetron increases substantially as a linear function of the tuner penetration throughout the desired range of frequencies, for example, up through 5850 megacycles at a tuner penetration of .425 inch as is indicated by point 42 on curve 40.

In prior devices the many families of tuner resonances would occur at frequencies close to the $\pi$ mode frequency of the magnetron at various points throughout the range of frequencies through which the magnetron $\pi$ mode frequency could be tuned. There is illustrated in Fig. 5, by way of example, a curve 43 in dotted lines which illustrates the variation of a tuner resonance frequency as a function of tuner penertation for a particular configuration and set of dimensions, said resonance frequency being the uppermost resonance frequency of the family of tuner resonances associated with the quarter wave length resonant condition of the tuner fingers. Specifically, curve 43 is the resonance frequency for a pair of tuner fingers which, with the loads coupled thereto by the splines 24 and anode vanes 13, is an electrical quarter wave length long. This tuner resonance coincides with the $\pi$ mode frequency at point 41 and rapidly decreases with tuner penetration until with the tuner penetration of .025 the curve 43 passes through a frequency of 5200 megacycles as is indicated by point 44. This occurs when the tuner fingers are substantially entirely extracted from the anode structure and, therefore, the spline 24 is closer to the open ends of the transmission lines made up by the tuner fingers. Accordingly, it acts substantially as a capacitive load on the transmission line and lowers the frequency thereof. Thus it is apparent that, if the capacitive load presented by the spline 24 to the transmission line were not present, the resonance frequency illustrated by curve 43 would at zero penetration lie considerably above 5400 megacycles, for example, as high as 5700 or 5800 megacycles. Thus as the tuner structure was inserted into the anode structure, the curve 43 would drop in frequency and would cross the operating curve 40 of the magnetron thereby causing an interference. Thus it may be seen that, by the use of a properly disposed load 24, the quarter wave length resonance family of the tuner anode structure may be considerably lowered in frequency to a point where interference is eliminated between this family and the operating frequency of the magnetron over a wide range of frequencies. In practice it has been possible to move the curve 43 still lower than that shown in the graph so that it will not interfere with the $\pi$ mode operating frequency at zero penetration as is shown at point 41 on the graph. This can be done by increasing the length of the tuner fingers, or increasing the capacitance presented to the tuner fingers by the splines or both.

There is also illustrated on the graph in Fig. 5 a curve 45 which indicates the lowest resonance frequency of the family of tuner resonances where the tuner fingers and their associated loads are substantially three quarters of an electrical wave length long. Curve 45 has a frequency of 6000 megacycles at a tuner penetration of approximately .01 inch as is indicated by point 46 on the graph. Curve 45 drops rapidly in frequency as tuner penetration increases and reaches a minimum frequency of approximately 5650 megacycles at a tuner penetration of approximately .08 inch as is indicated by point 47 of curve 45. As tuner penetration is increased further, the frequency of curve 45 again increases. In practice the resonance condition in this region has been found to disappear, due possibly to absorption or selective loading. Another curve of the same tuner resonance family as curve 44 is illustrated as curve 48, curve 48 being of the same general shape as curve 45, but being positioned at higher frequencies for the same relative tuner penetration.

In the absence of the load produced by the splines 24 on the transmission line made up of the tuner fingers 25, the three-quarter wave length resonances illustrated by curves 45 and 48 would decrease continuously with tuner penetration and would cross the curve 40 somewhere in the middle of the desired operating frequency range of the magnetron $\pi$ mode. However, with the spline 24 inserted between the tuner fingers 25, penetration of the tuner fingers into the anode structure causes the spline 24 to shift into a region where there are high currents in the transmission line, and, accordingly, the metallic spline 24 acts as an inductive load in parallel with the transmission line thereby decreasing the effective electrical length of the line, and thereby increasing the resonance frequency of the transmission line made up of the tuner fingers for the particular family of resonances illustrated by curves 45 and 48. This more than compensates for the capacitive load coupled to the tuner fingers by the anode member 13.

Thus it may be seen that, by the insertion of the proper load within the transmission line made up of the tuner fingers outside the anode cavities and spaced from the short circuit between the tuner fingers produced by the tuner support structure, the families of resonances in the tuner structure may be controlled by separating the families or shifting the frequencies of the families. It is to be clearly understood that the spreading of the families of quarter wave length and three-quarter wave length tuner resonances disclosed herein is by way of example only, and, if desired, under certain conditions the operating frequency of the magnetron may be positioned below the quarter wave length tuner resonance family, or above the three-quarter wave length tuner resonance family. The use of the magnetic pole piece splines as the reactive load coupled to the tuner fingers is by way of example only, and any desired reactive load could be used. Furthermore, the load, such as the magnetic pole piece splines, could be made movable with the tuner fingers, if so desired.

This completes the description of the particular embodiment of the invention illustrated herein. However, many modifications thereof will be apparent to persons skilled in the art without departing from the spirit and scope of this invention. For example, the tuning structure could be made to vary the capacitance of the anode cavities rather than the inductance, or indeed could be made to vary both the cavity and inductance according to well-known practice. Furthermore, the magnetron anode structure illustrated herein is by way of example only, and could be of the unstrapped type, or of the rising sun type. Accordingly, it is desired that this invention be not limited to the particular species illustrated herein except as defined by the appended claims.

What is claimed is:

1. An electron discharge device comprising a source of electrons, an anode structure spaced from said source, said anode structure comprising a plurality of anode members, pairs of adjacent anode members together with the spaces therebetween defining resonant cavities, conductive tuning elements extending into said cavities from a support structure, adjacent pairs of said tuning elements having substantially short circuit electrical connections therebetween at said support structure, and reactive loads coupled to said fingers at points outside said cavities and substantially spaced from said electrical connections.

2. An electron discharge device comprising a cathode, an anode structure spaced from said cathode, said anode structure comprising a plurality of anode members, pairs of adjacent anode members together with the space, therebetween defining resonant cavities, conductive tuning elements extending into said cavities from a support structure, adjacent pairs of said tuning elements having substantially short circuit electrical connections therebetween at said support structure, and reactive loads coupled to said fingers at points outside said cavities and substantially spaced from said electrical connections.

3. An electron discharge device comprising a source of electrons, an anode structure spaced from said source, means for directing electrons along paths adjacent said anode structure, said anode structure comprising a plurality of anode members, pairs of adjacent anode members together with the spaces therebetween defining resonant cavities, conductive tuning elements extending into said cavities from a support structure, adjacent pairs of said tuning elements having substantially short circuit electrical connections therebetween at said support structure, and reactive loads coupled to said fingers at points outside said cavities and substantially spaced from said electrical connections.

4. An electron discharge device comprising a source of electrons, an anode structure spaced from said source, means for directing electrons along paths adjacent said anode structure, comprising means for producing a magnetic, field, said anode structure comprising a plurality of anode members, pairs of adjacent anode members together with the spaces therebetween defining resonant cavities, conductive tuning elements extending into said cavities from a support structure, adjacent pairs of said tuning elements having substantially short circuit electrical connections therebetween at said support structure, and reactive loads coupled to said fingers at points outside said cavities and substantially spaced from said electrical connections.

5. An electron discharge device comprising a source of electrons, an anode structure spaced from said source, said anode structure comprising a plurality of anode members, pairs of adjacent anode members together with the spaces therebetween defining resonant cavities, conductive tuning elements extending into said cavities from a support structure, adjacent pairs of said tuning elements having electrical substantially short circuit connections therebetween at said support structure, and reactive loads coupled to said fingers at points outside said cavities and substantially spaced from said electrical connections.

6. An electron discharge device comprising a source of electrons, an anode structure spaced from said source, means for directing electrons along the paths adjacent said anode structure, said anode structure comprising a plurality of anode members, pairs of adjacent anode members together with the spaces therebetween defining resonant cavities, conductive tuning elements extending into said cavities from a support structure, adjacent pairs of said tuning elements having electrical substantially short circuit connections therebetween at said support structure, and reactive loads coupled to said fingers at points outside said cavities and substantially spaced from said electrical connections.

7. An electron discharge device comprising a source of electrons, an anode structure spaced from said source, means for directing electrons along paths adjacent said anode structure, comprising means for producing a magnetic field, said anode structure comprising a plurality of anode members, pairs of adjacent anode members together with the spaces therebetween defining resonant cavities, conductive tuning elements extending into said cavities from a support structure, adjacent pairs of said tuning elements having electrical substantially short circuit connections therebetween at said support structure, and reactive loads coupled to said fingers at points outside said cavities and substantially spaced from said electrical connections.

8. An electron discharge device comprising a cathode, an anode structure spaced from said cathode, said anode structure comprising a plurality of anode members, pairs of adjacent anode members together with the spaces therebetween defining resonant cavities, conductive tuning elements extending into said cavities from a support structure, adjacent pairs of said tuning elements having electrical substantially short circuit connections therebetween at said support structure, and reactive loads coupled to said fingers at points outside said cavities and substantially spaced from said electrical connections.

9. An electron discharge device comprising a source of electrons, an anode structure spaced from said source, said anode structure comprising a plurality of anode members, pairs of adjacent anode members together with the spaces therebetween defining resonant cavities, a tuning structure having conductive tuning elements extending into said cavities from a support structure, adjacent pairs of said tuning elements having electrical connections therebetween at said support structure, and reactive loads coupled to said fingers at points outside said cavities and substantially spaced from said electrical connections.

10. An electron discharge device comprising a source of electrons, an anode structure spaced from said source, said anode structure comprising a plurality of anode members, pairs of adjacent anode members together with the spaces therebetween defining resonant cavities, a tuning structure movable with respect to said anode structure having conductive tuning elements extending into said cavities from a support structure, adjacent pairs of said tuning elements having substantially short circuit electrical connections therebetween at said support structure, and reactive loads coupled to said fingers at points outside said cavities and substantially spaced from said electrical connections.

11. An electron discharge device comprising a source of electrons, an anode structure spaced from said source, means for directing electrons along paths adjacent said anode structure, said anode structure comprising a plurality of anode members, pairs of adjacent anode members together with the spaces therebetween defining cavities, a tuning structure movable with respect to said anode structure having conductive tuning elements extending into said cavities from a support structure, adjacent pairs of said tuning elements having substantially short circuit electrical connections therebetween at said support structure, and reactive loads coupled to said fingers at points outside said cavities and substantially spaced from said electrical connections.

12. An electron discharge device comprising a source of electrons, an anode structure spaced from said source, means for directing electrons along paths adjacent said anode structure comprising means for producing a magnetic field, said anode structure comprising a plurality of anode members, pairs of adjacent anode members together with the spaces therebetween defining resonant cavities, a tuning structure movable with respect to said anode structure having conductive tuning elements extending into said cavities from a support structure, adjacent pairs of said tuning elements having substantially short circuit electrical connections therebetween at said support structure, and reactive loads coupled to said fingers at points outside said cavities and substantially spaced from said electrical connections.

13. An electron discharge device comprising a source of electrons, an anode structure spaced from said source, said anode structure comprising a plurality of anode members, pairs of adjacent anode members together with the spaces therebetween defining cavities, a tuning structure having conductive tuning elements extending into said cavities from a support structure, adjacent pairs of said tuning elements having substantially short circuit electrical connections therebetween at said support structure, reactive loads coupled to said fingers at points outside said cavities and substantially spaced from said electrical connections, said tuning structure having a plurality of resonant frequencies, and said loads reflecting reactances of different sign to said tuning structure at different of said resonant frequencies.

14. An electron discharge device comprising a source of electrons, an anode structure spaced from said source, said anode structure comprising a plurality of anode members, pairs of adjacent anode members together with the spaces therebetween defining cavities, a tuning structure movable with respect to said anode structure having conductive tuning elements extending into said cavities from a support structure, adjacent pairs of said tuning elements having substantially short circuit electrical connections therebetween at said support structure, reactive loads coupled to said fingers at points outside said cavities and substantially spaced from said electrical connections, said tuning structure having a plurality of resonant frequencies, and said loads reflecting reactances of different sign to said tuning structure at different of said resonant frequencies.

References Cited in the file of this patent

UNITED STATES PATENTS

| | | |
|---|---|---|
| 2,450,619 | Sonkin | Oct. 5, 1948 |
| 2,508,576 | Kusch | May 23, 1950 |